United States Patent
Hofmann et al.

(10) Patent No.: US 9,057,131 B2
(45) Date of Patent: Jun. 16, 2015

(54) SEPARATING DEVICE FOR PROCESS CHAMBERS OF VACUUM COATING INSTALLATIONS AND VACUUM COATING INSTALLATION

(75) Inventors: Michael Hofmann, Dresden (DE); Jochen Krause, Dresden (DE)

(73) Assignee: VON ARDENNE GmbH, Dresden (DE)

(*) Notice: Subject to any disclaimer, the term of this patent is extended or adjusted under 35 U.S.C. 154(b) by 1831 days.

(21) Appl. No.: 12/092,328

(22) PCT Filed: Nov. 21, 2006

(86) PCT No.: PCT/DE2006/002059
§ 371 (c)(1),
(2), (4) Date: Jul. 23, 2008

(87) PCT Pub. No.: WO2007/059749
PCT Pub. Date: May 31, 2007

(65) Prior Publication Data
US 2009/0139452 A1 Jun. 4, 2009

(30) Foreign Application Priority Data
Nov. 21, 2005 (DE) .......................... 10-2005-055-810

(51) Int. Cl.
*C23C 14/56* (2006.01)
*C23C 16/54* (2006.01)

(52) U.S. Cl.
CPC .............. *C23C 14/568* (2013.01); *C23C 16/54* (2013.01)

(58) Field of Classification Search
USPC ................ 118/719, 733; 156/345.31, 345.32; 204/298.25
See application file for complete search history.

(56) References Cited

U.S. PATENT DOCUMENTS 3,568,632 A 3/1971 Cawthon
4,911,810 A * 3/1990 Lauro et al. .............. 204/192.12
(Continued)

FOREIGN PATENT DOCUMENTS

DE 19733940 A1 * 2/1999
EP 1348777 A2 10/2003
(Continued)

OTHER PUBLICATIONS

The International Search Report for PCT/DE2006/002059, dated Mar. 13, 2007.

*Primary Examiner* — Karla Moore
(74) *Attorney, Agent, or Firm* — Heslin Rothenberg Farley & Mesiti P.C.

(57) ABSTRACT

A separating device for process chambers arranged one after the other in a vacuum coating installation for coating two-dimensional substrates comprises a separating element which can be fitted between two process chambers transversely in relation to the transporting direction of the substrates. The element comprises a passage for the substrate that is arranged in the region of the transporting plane of the substrate and formed by at least one through-opening provided in the separating element, and includes at least one closure, optionally closing or opening the passage. An intermediate chamber formed by intermediate chamber outer walls is also provided and the separating element is arranged inside the intermediate chamber and the intermediate chamber is subdivided into two intermediate chamber segments. In this configuration, the separating device forms a chamber of its own, arranged between two neighboring process chambers.

16 Claims, 1 Drawing Sheet

(56) References Cited

U.S. PATENT DOCUMENTS

| | | | |
|---|---|---|---|
| 5,940,684 A * | 8/1999 | Shakuda et al. | 438/46 |
| 7,776,192 B2 * | 8/2010 | Erbkamm et al. | 204/298.07 |
| 2005/0199493 A1 | 9/2005 | Bangert et al. | |
| 2006/0278164 A1 * | 12/2006 | Petrach et al. | 118/719 |
| 2007/0205385 A1 * | 9/2007 | Krause et al. | 251/195 |
| 2007/0256934 A1 * | 11/2007 | Perata et al. | 204/298.23 |

FOREIGN PATENT DOCUMENTS

| | | |
|---|---|---|
| JP | 02058832 A | 2/1990 |
| SU | 515834 A1 | 5/1976 |
| WO | WO 89/12702 A | 12/1989 |
| WO | WO 2005045092 A2 * | 5/2005 |
| WO | WO 2005106069 A1 * | 11/2005 |

* cited by examiner

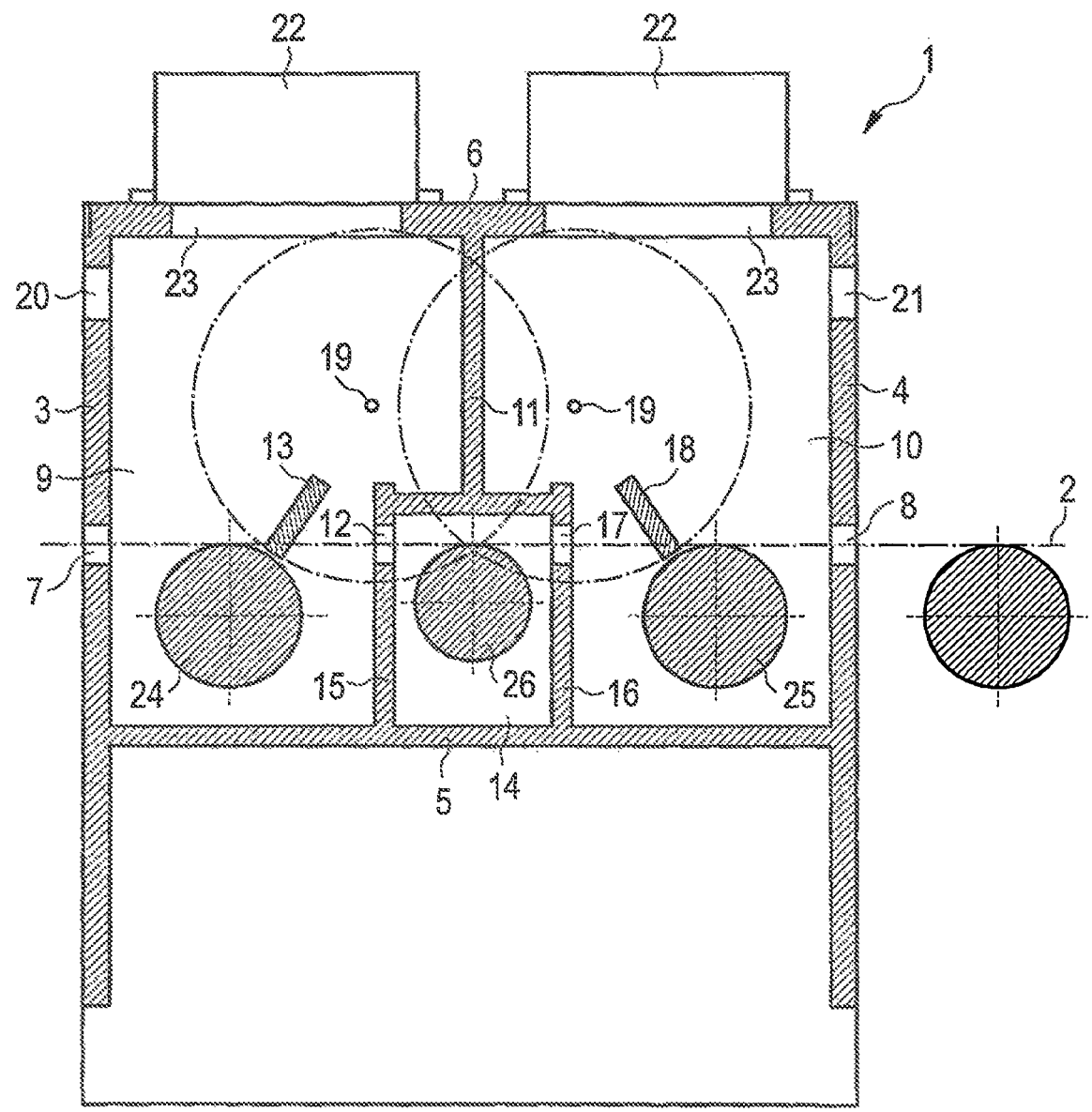

SEPARATING DEVICE FOR PROCESS CHAMBERS OF VACUUM COATING INSTALLATIONS AND VACUUM COATING INSTALLATION

CROSS REFERENCE TO RELATED APPLICATIONS

This application is a national stage filing under section 371 of International Application No. PCT/DE2006/002059, filed on Nov. 21, 2006, and published in German on May 31, 2007 as WO 2007/059749 and claims priority of German application No. 10 2005 055 810.0 filed on Nov. 21, 2005 the entire disclosure of these applications being hereby incorporated herein by reference.

BACKGROUND ART

The present invention relates to a separating device for process chambers of vacuum coating installations.

In vacuum coating installations for coating elongate, flat substrates such as flat glass panes by way of example, for the purpose of producing a layer arrangement composed of several layers of different coating materials one after the other, the substrate is moved through several process chambers disposed one after the other. In each of these process chambers, the substrate is coated with a coating material, for example, by sputtering, thermal evaporation or other coating processes, or the substrate is exposed to an etching process, for example, by sputtering or ion beam etching. Such processes mostly take place at a pressure that is clearly lower (low pressure, vacuum) than the atmospheric pressure, it being also possible to introduce process gases (inert or reactive) into the respective process chamber depending on the coating material. A transporting device, which extends through the entire arrangement, is mostly provided for transporting the substrate through the vacuum coating installation. This transporting device can consist, for example, of a plurality of rollers, which are disposed transversely to the transporting direction of the substrate and on which the substrate is placed. The uppermost surface line of these rollers thus defines the transporting plane and at least one of these rollers can be driven.

Lock chambers are each usually disposed at the start and end of the arrangement of process chambers, which lock chambers serve for the controlled feeding and discharge of the substrates during operation. In some vacuum coating installations, pump chambers are further provided between every two process chambers, which pump chambers serve for separating the process atmospheres of adjacent process chambers. For producing and maintaining the process pressure, vacuum pumps can be provided in the lock chambers, in one or more process chambers and in the pump chambers, if these exist.

The separation of different process atmospheres of adjacent process chambers is of fundamental importance to the quality of the coating processes since a gas exchange between process chambers having different process atmospheres can result in contaminated layers or the formation of undesirable combinations of the coating material with components of the process gas that precipitate on the substrate.

BRIEF SUMMARY OF INVENTION

It is therefore an aspect of the present invention to improve vacuum coating installations disclosed in the prior art to the effect that it is possible to separate the process atmospheres of adjacent process chambers easily and economically. It is another aspect of the present invention to enable the ventilation of a process chamber while maintaining in the adjacent process chamber the process atmosphere that is prevailing therein. In other words, the pressure ratios prevailing in a process chamber and the gas mixture present there should not be adversely affected by the ventilation of an adjacent process chamber.

This aspect is achieved according to the invention by a separating device for process chambers of vacuum coating installations, and a vacuum coating installation as described hereinafter.

The separating device of the invention for process chambers disposed one after the other in a vacuum coating installation for coating two-dimensional substrates comprises a separating element, which can be fitted between two process chambers transversely in relation to the transporting direction of the substrates, which separating element comprises a passage for the substrate, which passage is disposed in the region of the transporting plane of the substrate and is formed by at least one through-opening provided in the separating element, and said separating device is characterized by the provision of at least one closure, optionally closing or opening the passage.

The separating device of the invention makes it possible to separate the process atmospheres of adjacent process chambers of a vacuum coating installation easily with respect to design and therefore economically, so that the pressure ratios prevailing in a process chamber and the gas mixture present there are not adversely affected by the ventilation of an adjacent process chamber. For example, the separating element can replace the connecting wall of a process chamber so that the passage for the substrates can be opened temporarily so that the substrate can be moved through the passage from one process chamber into the adjacent process chamber, or the passage for the substrates can be closed so that it is possible to ventilate one process chamber while maintaining in the adjacent process chamber the process atmosphere that is prevailing therein.

In an embodiment of the invention, two closures, which optionally close or open the passage from each side of the separating element, are provided. This embodiment is advantageous especially when the function of the closures used depends on the direction of the pressure gradient (one-way closures). The direction of the pressure gradient in turn depends on which of the two adjacent pressure chambers is supposed to be ventilated. The suggested design comprising a closure on each side of the separating element enables the separation of the adjacent process chambers for both cases with the use of one-way closures.

In another embodiment of the invention, at least one closure is designed as a plate, which can be moved out of the transporting plane. This plate is designed in such a way that it covers the passage completely and enables the substrate to be transported from one process chamber into the adjacent process chamber during the operation of the vacuum coating installation. For ventilating one of the two process chambers, this plate also prevents the transportation of the substrate and simultaneously prevents a pressure equalization between the adjacent process chambers. In a simple design form of the invention, the plate could be mounted such that it can be moved perpendicularly in relation to the transporting direction of the substrate. For example, the plate could be mounted in a guiding device, which is provided for this purpose and which enables this perpendicular movement.

At least one closure is advantageously designed as a plate, which can be swung out of the transporting plane. This design is particularly advantageous in terms of production since it makes it possible to dispense with the guiding mechanism described above, which requires relatively close tolerances. Furthermore, the swiveling movement can be implemented relatively easily by means of an electric motor drive.

Furthermore, at least one closure can be mounted such that it can be swiveled about a swivel axis located transversely in relation to the transporting direction of the substrate. It is thus possible to swivel the closure, for example, in the region above or below the transporting plane of the substrate where there is sufficient space so that the closure does not obstruct the transportation of the substrate.

Furthermore, at least one closure can advantageously comprise at least one sealing element for providing a seal between the closure and the separating element. The sealing element can be made of elastomer by way of example. The sealing element improves the desired separation of the process atmospheres.

In a simple and economical version of the invention, the separating element is designed as a partition wall comprising a through-opening forming the passage for the substrate. This partition wall can be made, for example, of a steel plate at the through-opening of which one or more closures are provided, which temporarily open or close the through-opening. This separating element is suitable for replacing the connecting wall of a process chamber.

Alternatively, the separating element can comprise two separating chamber walls at least in the vicinity of the passage, which two walls are at a distance from each other and are each provided with a through-opening forming the passage for the substrate. This separating element is likewise suitable for replacing a connecting wall of a process chamber. Especially, if two swiveling closures are provided, which are each disposed on one side of the separating element, this embodiment provides the advantage of preventing a collision between the swivel paths of the closures with those transporting rollers of a transporting device that are disposed on both sides of the separating element. That is, the double-walled design of the separating element at least in that region of the passage, in which the transporting rollers are also disposed, makes room for two swiveling closures when the distance of the transporting rollers must be maintained strictly.

In the embodiment of the invention with separating chamber walls that are disposed at a distance from each other, at least one transporting roller can be disposed between the separating chamber walls. In this way, the distance of the transporting rollers can be maintained in spite of the increased space required by the separating element in the transporting direction of the substrate.

According to a refinement of the invention, an intermediate chamber, which is formed by intermediate chamber outer walls, is also provided and the separating element is disposed inside the intermediate chamber and the intermediate chamber is subdivided into two intermediate chamber segments. In this embodiment, the separating device of the invention forms a chamber of its own, which may be disposed between two adjacent process chambers. If these process chambers have independent chamber connecting walls, then the intermediate chamber does not require any connecting walls of its own and can be directly connected to each end of the two process chambers. But also in the case of process chambers, which do not have any chamber connecting walls, the intermediate chamber can be connected to the process chambers, the intermediate chamber segments increasing the volume of the respective process chambers in this case.

According to the invention, at least one intermediate chamber connecting wall can also be provided, which is connected to the intermediate chamber outer walls, and which seals the intermediate chamber transversely in relation to the transporting direction of the substrates, and which is provided with a passage for the substrate formed by a through-opening. It is thus possible to dispense with chamber connecting walls in both the process chambers, between which the intermediate chamber is disposed.

In this embodiment, at least one vacuum opening for connecting an intermediate chamber segment to an adjacent process chamber is advantageously provided in at least one intermediate chamber connecting wall. This makes it possible to use the intermediate chamber segment adjoining the process chamber in order to generate or maintain a vacuum in the process chamber.

Furthermore, at least one vacuum opening is designed to be closeable. This makes it possible to reduce the gas exchange between the process chamber and the intermediate chamber segment.

In order to be able to use the intermediate chamber segment for evacuating the process chamber or for gas separation, at least one intermediate chamber outer wall advantageously comprises, in the region of at least one intermediate chamber segment, at least one pump opening for attaching a vacuum pump. A vacuum pump, which assists in generating or maintaining a vacuum in the intermediate chamber segment and/or in the adjoining process chamber, can then be fixed to this pump opening on the outer side of the intermediate chamber.

In another embodiment of the invention, at least one transporting roller is disposed in at least one intermediate chamber segment. Due to this, the arrangement of transporting rollers that is usually provided in the process chambers is not interrupted even inside the intermediate chamber, thereby ensuring the continuous transport of the substrate.

Furthermore, at least one transporting roller of the transporting device, i.e. a transporting roller disposed in an intermediate chamber segment and/or a transporting roller disposed between the wall segments of the separating element can be driven, thereby supporting the transport of the substrate through the intermediate chamber or through the passage of the double-walled separating element.

At least one transporting roller can be advantageously driven by a transporting device disposed in an adjacent process chamber. In this way, there is no requirement of a separate drive equipment for the transport rollers belonging to the separating device, thereby enabling a more economical production of the separating device.

The object of the invention is likewise achieved by a vacuum coating installation for coating two-dimensional substrates, which vacuum coating installation comprises at least two process chambers disposed one after the other, and a separating device of the type described above being disposed between two adjacent process chambers of said vacuum coating installation.

In the vacuum coating installation, at least one chamber connecting wall of at least one process chamber is designed as a separating device, which replaces a conventional chamber connecting wall and seals the process chamber.

Alternatively, in the vacuum coating installation, a separating device can be disposed at least between two adjacent process chambers, which separating device comprises an intermediate chamber, the intermediate chamber being connected to each end of the two adjacent process chambers.

BRIEF DESCRIPTION OF THE DRAWING FIGURES

The invention is explained below in more detail with reference to an exemplary embodiment and an associated drawing. The single FIG. 1 shows the separating device of the invention comprising an intermediate chamber 1 in which the separating element 11 separates the intermediate chamber 1 into two intermediate chamber segments 9, 10.

DETAILED DESCRIPTION

The intermediate chamber 1 is part of a vacuum coating installation for coating elongate, flat substrates in the through-flow principle, the substrates being guided in a transporting plane 2. The intermediate chamber 1 comprises a first intermediate chamber connecting wall 3 and a second intermediate chamber connecting wall 4, which is located opposite to the first intermediate chamber connecting wall 3, four intermediate chamber outer walls, which extend between the intermediate chamber connecting walls 3, 4, and one of which is designed as a base plate 5 and the other is designed as a cover 6 and the two other intermediate chamber outer walls are designed as side walls. In each intermediate chamber connecting wall 3, 4 through-openings 7, 8 are provided respectively, which are located in the transporting plane 2 and which forms a passage for the substrates. Furthermore, the intermediate chamber connecting walls 3, 4 each comprise vacuum openings 20, 21 respectively that are located above the transporting plane 2.

The interior of the intermediate chamber 1 comprises a separating element 11 comprising a double-walled region 14 (separating chamber), which is formed by two separating chamber walls 15, 16. The walls 15, 16 each comprise through-openings 12, 17 respectively, which jointly form a passage for the substrate through the double-walled region 14 of the separating element 11. The separating element 11 comprising the double-walled region 14 divides the intermediate chamber 1 into two intermediate chamber segments 9, 10. Two closures 13, 18, which are designed as swiveling plates, are each mounted about a horizontal swivel axis 19 and can be used for sealing the intermediate chamber segment 9, which is located to the left of the separating chamber 14, from the intermediate chamber segment, which is located to the right of the separating chamber 14, and vice versa. Each intermediate chamber segment 9, 10 can be ventilated while the other intermediate chamber segment 10, 9 remains under vacuum.

The cover 6 of the intermediate chamber 1 comprises two pump openings 23 and a vacuum pump 22, which is disposed on each of these pump openings 23 outside the intermediate chamber 1. The interior of the intermediate chamber 1 further comprises three transporting rollers 24, 25, 26, the first transporting roller 24 and the second transporting roller 25 each being disposed in intermediate chamber segments 9, 10 respectively, and the third transporting roller 26 being disposed between the separating chamber walls 15, 16. The transporting rollers 24, 25, 26 can each be driven by means of a transport system of the adjacent vacuum chambers.

Through the vacuum openings 20, 21 provided in the intermediate chamber connecting walls 3, 4, a sputtering process can be implemented, without restrictions, on the left or right side of the process chamber. There are no disadvantages with regard to permeance since the pumping is performed through the larger vacuum openings 20, 21 in the intermediate chamber connecting walls 3, 4 and not through the through-openings 7, 8. The intermediate chamber 1 can be used for gas separation between the adjacent process chambers. Therefore, an extra section for the vacuum pumps need not be provided in a configurable vacuum coating installation. The universality of the installation configuration is retained completely.

The invention claimed is:

1. Vacuum chamber of a vacuum coating installation for coating two-dimensional substrates, said vacuum chamber having a first connecting wall at one end, a second connecting wall at an opposite end, and a bottom base plate, a top cover, and two opposing outer side walls extending between the first and second connecting walls, and further comprising a separating device disposed inside the vacuum chamber including a separating element intermediate said first and second connecting walls and extending between the base plate and the top cover, the separating element having a double-walled region, fitted between two chamber segments, wherein the double-walled region of the separating element comprises first and second separating chamber walls each extending upwardly from the base plate transversely in relation to a transporting direction of the substrates and separated from each other in the transporting direction, each separating chamber wall having a separate respective aligned through-opening forming a passage for the substrates, the passage being disposed in a region of a transporting plane of the substrates, said separating device further including at least one closure, optionally closing or opening each respective through-opening in the first and second separating chamber walls from outside the double-walled region.

2. Vacuum chamber according to claim 1 wherein the at least one closure comprises a plate, adapted to be moved out of the transporting plane.

3. Vacuum chamber according to claim 1 wherein the at least one closure comprises a plate, adapted to be swung out of the transporting plane.

4. Vacuum chamber according to claim 1 wherein the at least one closure is mounted to be swiveled about a swivel axis located transversely in relation to the transporting direction of the substrates.

5. Vacuum chamber according to claim 1 wherein the at least one closure comprises at least one sealing element for providing a seal between the at least one closure and the separating element.

6. Vacuum chamber according to claim 1 wherein the separating element further includes a third wall connecting the first and second separating chamber walls above the transporting plane, and a fourth wall connecting the third wall to the top cover.

7. Vacuum chamber according to claim 1 further comprising at least one transporting roller disposed between the first and second separating chamber walls.

8. Vacuum chamber according to claim 7 wherein the at least one transporting roller is adapted to be driven.

9. Vacuum chamber according to claim 8 wherein the at least one transporting roller is adapted to be driven by a transporting device disposed in an adjacent process chamber.

10. Vacuum chamber according to claim 1, wherein the vacuum chamber comprises an intermediate chamber disposed between two process chambers of the vacuum coating installation, and the intermediate chamber is subdivided into the chamber segments by the separating element.

11. Vacuum chamber according to claim 10, wherein at least one of the first and second connecting walls seals the intermediate chamber transversely in relation to the transporting direction of the substrates, and is provided with a passage for the substrates formed by a through-opening.

12. Vacuum chamber according to claim 11 wherein at least one vacuum opening for connecting a chamber segment, of said two chamber segments, to an adjacent process chamber, of said two process chambers, is provided in at least one of the first and second connecting walls.

13. Vacuum chamber according to claim 12 wherein the at least one vacuum opening is adapted to be closeable.

14. Vacuum chamber according to claim 10, further comprising at least one pump opening for attaching a vacuum pump to the vacuum chamber.

15. Vacuum chamber according to claim 10 wherein at least one transporting roller is disposed in at least one of the chamber segments.

16. Vacuum coating installation for coating two-dimensional substrates, said vacuum coating installation comprising at least two process chambers disposed one after another, and a separating device disposed between two adjacent process chambers, of said at least two process chambers, the separating device including a separating element intermediate said two adjacent process chambers and extending between a base plate and a top cover, the separating element having a double-walled region comprising first and second separating chamber walls each extending upwardly from the base plate transversely in relation to a transporting direction of the substrates and separated from each other in the transporting direction, each separating chamber wall having a separate respective aligned through-opening forming a passage for the substrates, the passage being disposed in a region of a transporting plane of the substrates, said separating device further including at least one closure, optionally closing or opening each respective through-opening in the first and second separating chamber walls from outside the double-walled region, and wherein the separating device comprises an intermediate chamber disposed between the two adjacent process chambers, and the separating element is disposed inside the intermediate chamber, and the intermediate chamber is subdivided into two intermediate chamber segments by the separating element.

* * * * *